(12) United States Patent
Sauciuc et al.

(10) Patent No.: US 6,609,561 B2
(45) Date of Patent: Aug. 26, 2003

(54) TUNNEL-PHASE CHANGE HEAT EXCHANGER

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/023,989

(22) Filed: Dec. 21, 2001

(65) Prior Publication Data

US 2003/0116302 A1 Jun. 26, 2003

(51) Int. Cl.[7] .............................................. F28D 15/00
(52) U.S. Cl. ................ 165/104.33; 165/80.4; 165/104.21; 361/700; 174/15.2; 257/715
(58) Field of Search .................. 165/104.26, 104.33, 165/80.4; 361/699, 700; 174/15.2; 257/715

(56) References Cited

U.S. PATENT DOCUMENTS

| | | | | |
|---|---|---|---|---|
| 5,529,115 A | * | 6/1996 | Paterson | 165/104.33 |
| 6,315,033 B1 | * | 11/2001 | Li | 165/185 |
| 6,321,831 B1 | * | 11/2001 | Tanaka et al. | 165/104.33 |
| 6,341,645 B1 | * | 1/2002 | Tanaka et al. | 165/104.33 |

FOREIGN PATENT DOCUMENTS

GB        2059569 A  *  4/1981  ................. 361/700

* cited by examiner

*Primary Examiner*—Henry Bennett
*Assistant Examiner*—Terrell McKinnon
(74) *Attorney, Agent, or Firm*—Antonelli, Terry, Stout & Kraus, LLP

(57) ABSTRACT

A phase change heat exchanger and method for cooling a heat dissipating electronic component, such as an electronics package, transfers heat from the electronic component by way of a heatsink including a base in heat conducting relation with the electronic component and fins arranged in heat conducting relation at one end thereof with the base. The efficiency of the fins is increased by also transferring heat from the base to the fins at a location spaced from the one end thereof using a phase change fluid separated from the fins. A chamber containing the phase change fluid is defined between two telescoping tubes which extend peripherally about the fins to form a tunnel or duct through which a cooling fluid such as air can be flowed in contact with the fins. A further increase in cooling efficiency is obtained using an additional remote heat exchangers attached to the surface of the chamber.

26 Claims, 4 Drawing Sheets

COPPER FOLDED FINS 3

HOT AIR OUT

COLD AIR IN

COPPER BASE/ VAPOR CHAMBER 2

TUNNEL-PHASE CHANGE HEAT EXCHANGER

FIELD

The present invention relates to heatsinks and a method of cooling heat dissipating electronic components such as electronic circuit modules/packages. More particularly, the invention is a phase change heat exchanger combining a heatsink and a phase change fluid cooling system for increased heat rejection capability. Fin efficiency of the heatsink is increased to enhance heat transfer and reduce thermal resistance.

BACKGROUND

The speed and power capabilities of electronic circuit modules are severely limited without an efficient mechanism to transfer heat therefrom. A known solution to this problem is to cool the electronics package using a fin heatsink. A conventional fin heatsink has a base, which can be formed of solid metal or with a vapor chamber, and fins attached to the base. The fins are typically constructed from parallel plates or folded fins. One end of the fins is attached to the base. An example of the prior art fin heatsink is depicted in FIGS. 1 and 2 of the drawings wherein a heatsink 1 comprises a base 2 formed of copper, either solid or containing a vapor chamber therein, and fins 3. The fins 3 are copper folded fins in the heatsink 1, but other fin constructions such as parallel plates may be used.

A problem with these conventional fin heatsinks used in electronics package cooling is their limited heat rejection capability. There is a need for a more efficient heat transfer mechanism which will provide increased heat rejection capability in electronics package cooling as compared with the conventional heatsinks.

Conventional vapor chambers used in heatsink bases to reduce the spreading resistance of the heatsink bases have not been found to provide significant thermal improvement for most processor cooling applications compared with the use of solid copper or even solid aluminum heatsink bases. In addition, a minor manufacturing fault during the fabrication of the conventional vapor chambers may result in a complete non-operation of the thermal solution. There is a need for a more reliable heat transfer system and method for cooling electronic components.

The present invention addresses these problems. Features and advantages of the present invention will become apparent from the following detailed description when taken in connection with the accompanying drawings which show, for purposes of illustration only, two example embodiments in accordance with the present invention.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings.

Detailed Description

Figure 1:
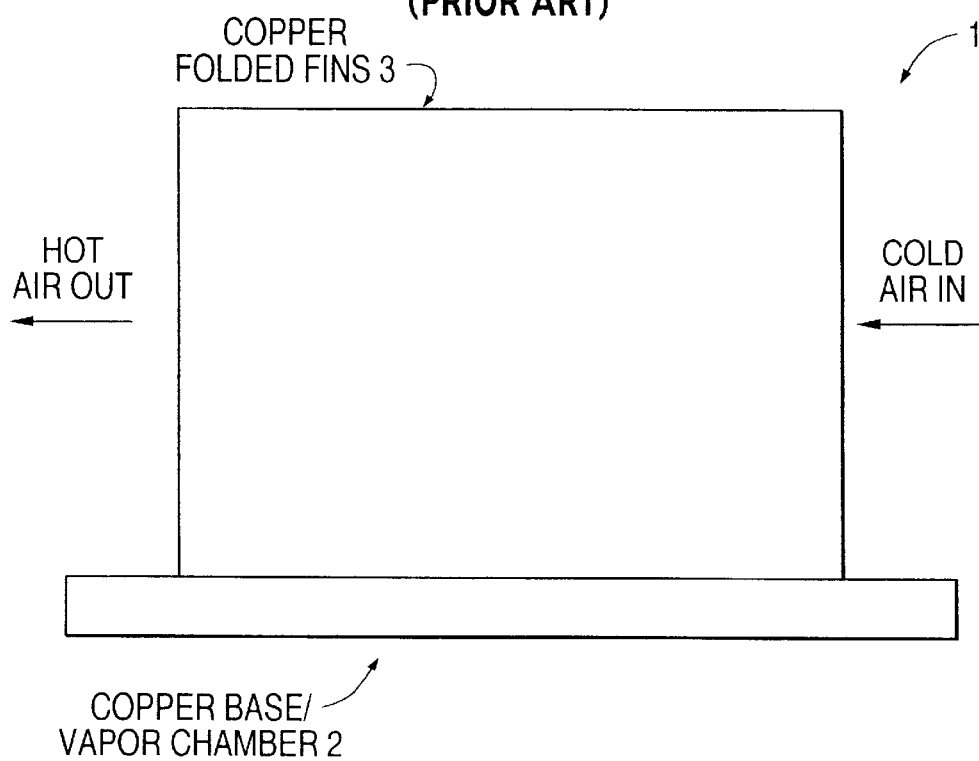
FIG. 1 is a side view of a conventional heatsink for cooling an electronic component.
Figure 2:
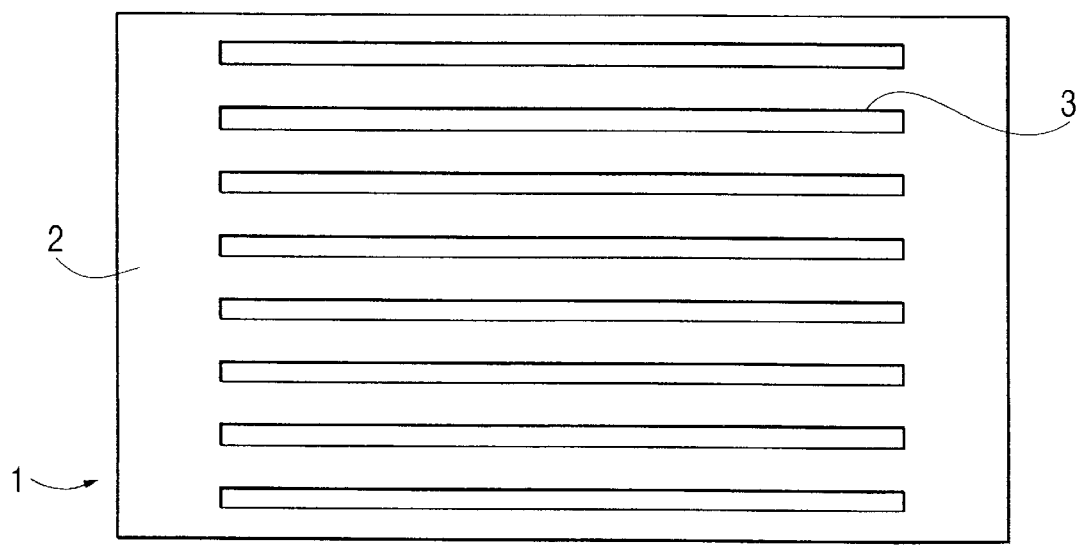
FIG. 2 is a top view of the conventional heatsink of FIG. 1.
Figure 4:
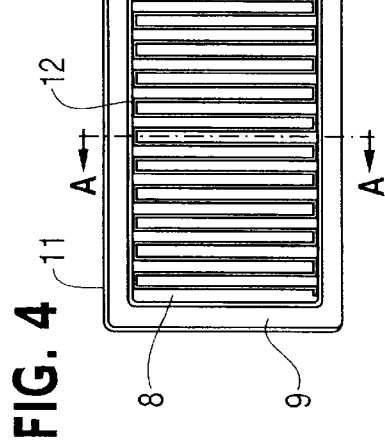
FIG. 4 is a side view of the one end of the phase change heat exchanger shown in FIG. 3.

Referring now to FIGS. 3–8 of the drawings, a "tunnel" phase change heat exchanger 4 according to the present invention comprises, in combination, a heatsink 5 and a phase change fluid cooling system 6. The heatsink 5 includes a base 7 and fins 8 arranged in heat conducting relation at one end thereof with the base, see FIGS. 7 and 8. The base is in the form of a tapered solid metal block formed of copper, for example. The fins 8 are copper folded fins in the example embodiment but another fin construction, e.g., plate fins, could be employed.

Figure 7:
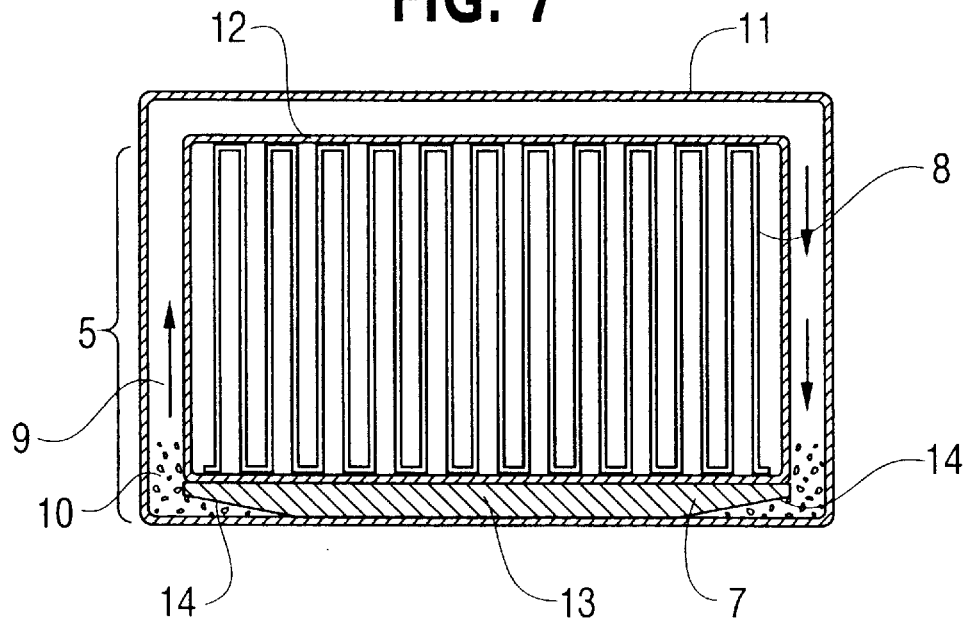
FIG. 7 is a slightly enlarged, sectional view of the phase change heat exchanger of the example embodiment taken along the section line B—B in FIG. 6.
Figure 8:
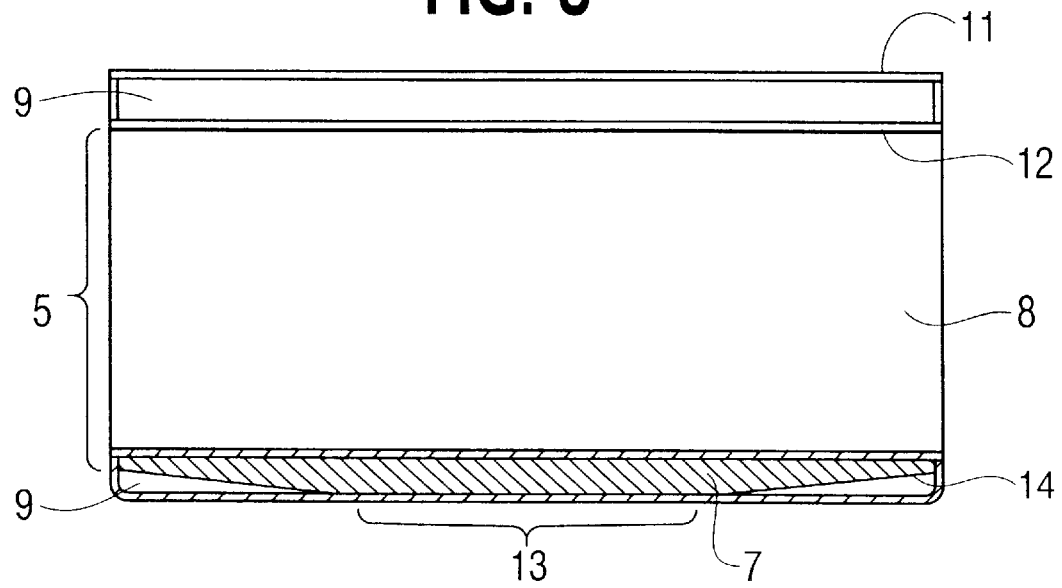
FIG. 8 is a slightly enlarged, sectional view of the phase change heat is exchanger taken along the section line A—A in FIG. 4.

The phase change fluid cooling system 6 extends apart from the fins of the heatsink from the base to an end of the fins opposite the end thereof in heat conducting relation with the base. As shown in FIG. 7, the phase change fluid cooling system includes a vapor chamber 9 and a phase change fluid 10 contained within the chamber 9. The chamber is defined between coextensive, telescoping, rectangular tubes 11 and 12. The chamber 9 extends peripherally of the fins and is sealingly closed at the ends of the tubes to contain the phase change fluid in the vapor chamber. The tubes can be formed of aluminum or copper, for example. Water can be used as the phase change fluid 10 with copper metal tubes, or the phase change fluid could be a refrigerant such as R123, ammonia, alcohol or other phase change fluid. The chamber 9 surrounds the fins 3 with the lower and upper ends of the fins contacting the inner surface of the tube 12 as shown in FIGS. 7 and 8. The inner tube 12 is open at each of its ends to permit the flow of air or other fluid coolant through the tube 12 for heat exchange with the fins 3 therein.

Figure 6:
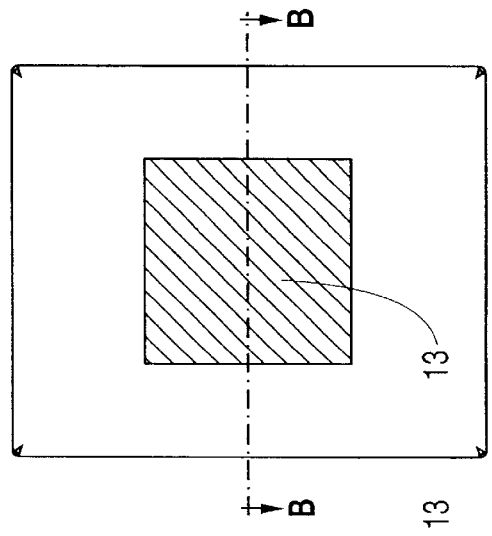
FIG. 6 is a top view of the phase change heat exchanger of FIGS. 3–5 with the cross-hatching added to depict the area of the smaller lower end of the tapered base of the heatsink at the bottom of the heat exchanger.
Figure 3:
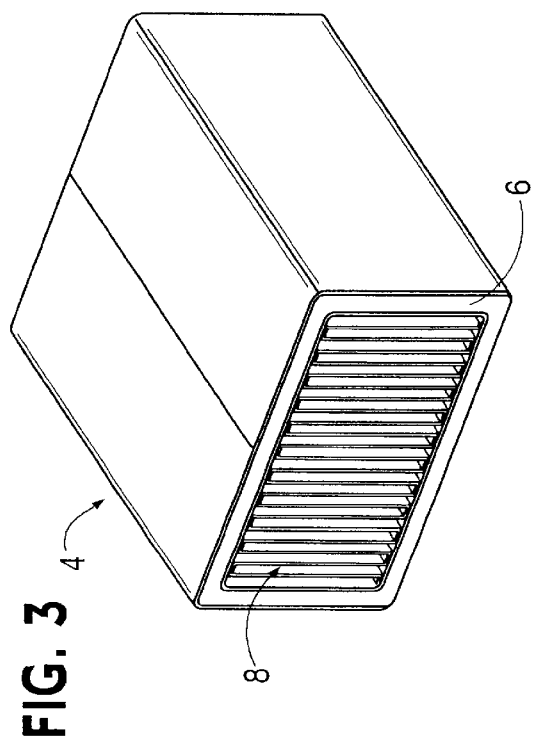
FIG. 3 is a perspective view from the right side of one end and above an example embodiment of a phase change heat exchanger according to the present invention.
Figure 5:
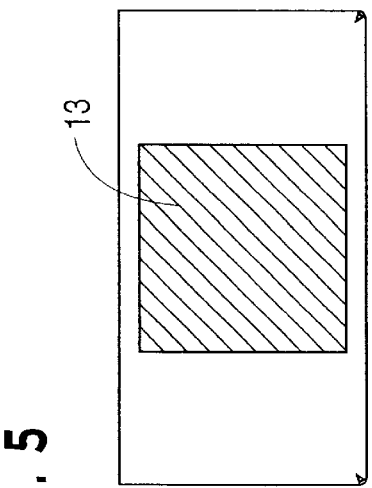
FIG. 5 is a side view of the right side of the phase change heat exchanger of FIGS. 3 and 4 with cross-hatching added to show the section of the heat exchanger immediately above the smaller, lower end of the tapered base of the heatsink in the heat exchanger.

The base 7 of the heatsink is located within the chamber 9 where, at its thickest, central portion, outlined in cross-hatching at 13 in FIG. 6, it extends completely across the chamber contacting both the inner and outer tubes as seen in FIGS. 7 and 8. Thus, when the heat exchanger 4 is placed with its lower, outer surface of tube 11 against an electronic component to be cooled, heat can be conducted directly from the electronic component through outer tube 11 and the base 7 of the heatsink to the inner tube 12 and, in turn, the ends of the fins 8 in thermal conducting relation thereto by way of inner tube 12 as illustrated in FIGS. 7 and 8. The base 7 is surrounded by the phase change fluid in the chamber 9, as is apparent from a consideration of FIGS. 6–8, because the lower surface of the base 7 is tapered upwardly at 14 completely about the periphery of the central portion 13 of the base.

The phase change heat exchanger 4 provides two paths for heat rejection: a first one—via solid block 7 to the fins 8 as referred to above, and a second path—via solid block 7 to the phase change fluid. The phase change fluid absorbs heat by vaporizing and rejects the heat to the tips of the fins and, optionally, to additional remote heat exchangers 15 as shown in the example embodiment of FIG. 9. Because both the upper and lower ends of the individual fins 8 are in thermal contact with hot surfaces, their efficiency will be increased, thus enhancing the heat transfer. In addition, the "tunnel" shape of the chamber 9 between the tubes 11 and 12 allows flow separation of the liquid and vapor phases of the phase change fluid within the chamber as a result of asymmetric heating or construction of the vapor chamber. The relatively large vapor space thermal path length provided in the chamber 9 for the phase change fluid compared with conventional chambers results in lower spreading resistance. The reliability of the heat exchanger 4 is also relatively high. In the case of a failure of the phase change system, the fins 8 can still reject some of the heat as they remain in conductive heat relation with the base over the central portion 13. The tunnel-shaped chamber 9 is advantageously easily manufactured using commercially available rectangular tubes.

Figure 9:
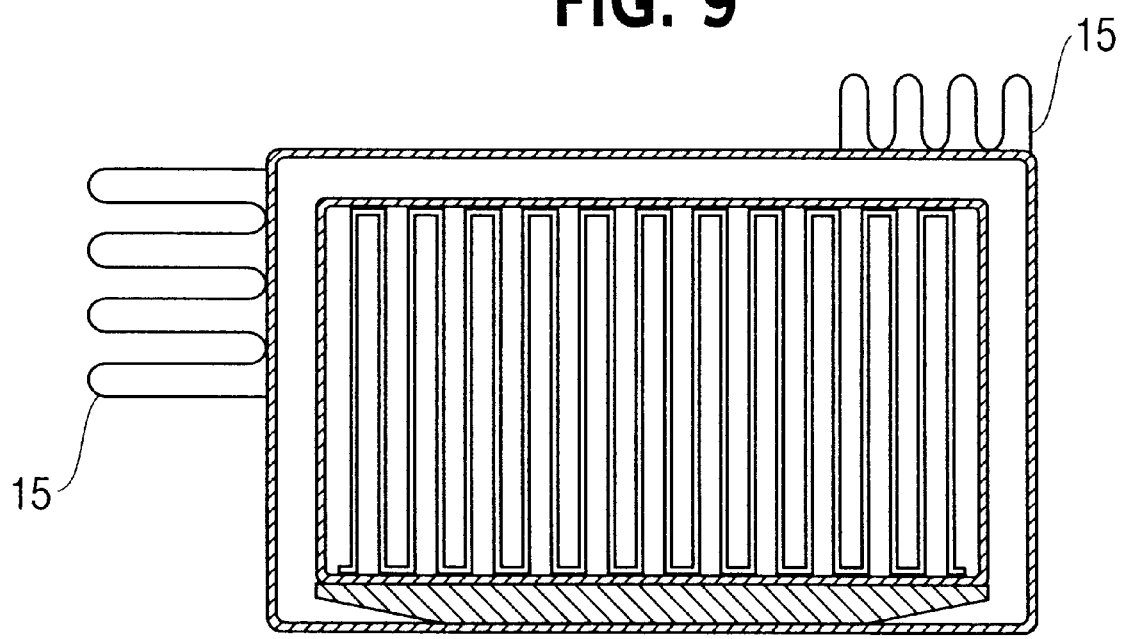
FIG. 9 is a sectional view like FIG. 7 of another example embodiment of the invention having additional remote heat exchangers engaging the external surface of the vapor chamber of the phase change heat exchanger.

In use against a heat dissipating electronic module, the tapered solid metal block or base 7 in heat conducting relation with the electronics module constitutes an evaporator area. The phase change fluid in contact with the tapered block will be evaporating. The vapor will reject the heat either to the end of the fins (tip or bottom) or to an external remote heat exchanger 15 as shown in FIG. 9. Because both ends of the individual fins are in thermal contact with hot surfaces, the fin efficiency will be increased, thus enhancing the heat transfer. Vaporized fluid moving to the upper portion of the chamber opposite the upper end of the fins will be cooled in a condenser area of the chamber to give up its heat of vaporization to the tips of the fins.

The improved passive cooling system of the present invention is easy to manufacture at relatively low cost. It provides an increased heat rejection capability as compared with conventional heatsinks because of its increased fin efficiency and reduced thermal resistance. A high reliability is also a feature of the invention.

While we have shown and described only two example embodiments in accordance with the present invention, it is understood that the same is not limited thereto, but is susceptible to numerous changes and modifications as known to those skilled in the art. For example, the tunnel-shaped chamber 9 can be extended at one or both of its longitudinal ends as a duct through which the flow of cooling air can be guided to the fins within the tunnel formed by the chamber. This feature would be useful in serially cooling with several phase change heat exchangers of the present invention respective processors, for example, in a server with forced ventilation from a common fan. Extension of the duct formed by tubes 11 and 12 of the phase change heat exchanger also facilitates the use of additional remote heat exchangers which can be positioned spaced from the electronics module in a convenient location within a housing/cabinet of the electronic component being cooled while remaining in contact with an outer surface of the chamber for extracting heat from the phase change fluid therein. Therefore, we do not wish to be limited to the details shown and described herein, but intend to cover all such changes and modifications as are encompassed by the scope of the appended claims.

We claim:

1. A phase change heat exchanger to cool a heat dissipating electronic component comprising:

a heatsink including a base to be mounted in heat conducting relation to a heat dissipating electronic component, and fins arranged in heat conducting relation with the base to reject heat along a first path from the base to the fins; and a chamber containing a phase change fluid, the chamber extending apart from the fins from an evaporator area where the phase change fluid is in heat absorbing relation with the base to a condenser area where the phase change fluid is in heat releasing relation with the fins at a location spaced from the base to eject heat along a second path from the base to the fins, wherein the base is a tapered metal block.

2. A system to cool a heat dissipating electronic component comprising:

a heatsink including a base to be arranged in heat conducting relation to an electronic component to be cooled and fins arranged in heat conducting relation at one end thereof with the base; and a chamber containing a phase change fluid extending peripherally of the fins from the base to a second end of the fins opposite the one end thereof; and further comprising an additional remote heat exchanger in heat conducting relation with the phase change fluid in the chamber, wherein the additional remote heat exchanger contacts an external surface of the chamber at a location spaced from the base.

3. A system to cool a heat dissipating electronic component comprising:

a heatsink including a base to be arranged in heat conducting relation to an electronic component to be cooled and fins arranged in heat conducting relation at one end thereof with the base; and a chamber containing a phase change fluid extending peripherally of the fins from the base to a second end of the fins opposite the one end thereof, wherein the base is a tapered solid metal block located within the chamber in heat conducting relation with the one end of the fins.

4. A phase change heat exchanger to cool a heat dissipating electronic component comprising:

a heatsink including a base to be mounted in heat conducting relation to a heat dissipating electronic component, and fins arranged in heat conducting relation with the base to reject heat along a first path from the base to the fins; and a chamber defined between the inner surface of a first tube and the outer surface of a second tube telescoped within the first tube, the chamber containing a phase change fluid and extending apart from the fins from an evaporator area where the phase change fluid is in heat absorbing relation with the base to a condenser area where the phase change fluid is in heat releasing relation with the fins at a location spaced from the base to eject heat along a second path from the base to the fins.

5. The phase change heat exchanger according to claim 1, wherein the chamber extends peripherally of the fins.

6. The phase change heat exchanger according to claim 1, wherein the chamber forms a tunnel around the fins.

7. The phase change heat exchanger according to claim 6, wherein opposite ends of the fins are in thermal contact with the inner surface of the tunnel.

8. The phase change heat exchanger according to claim 1, wherein the base is located within the chamber and extends completely across the chamber contacting both the first and second tubes in heat conducting relation with one of the opposite ends of the fins.

9. The phase change heat exchanger according to claim 1, wherein the base is located within the chamber.

10. The phase change heat exchanger according to claim 1, wherein the base is surrounded by phase change fluid.

11. The phase change heat exchanger according to claim 1, further comprising an additional remote heat exchanger in heat conducting relation with the phase change fluid in the chamber.

12. The phase change heat exchanger according to claim 11, wherein the additional remote heat exchanger contacts an external surface of the chamber at a location spaced from the base.

13. A heat transfer system comprising:
   a heatsink including a base and fins arranged in heat conducting relation at one end thereof with the base; and
   a phase change fluid cooling system extending apart from the fins from the base to a second end of the fins opposite the one end thereof;
   wherein the phase change fluid cooling system includes a chamber containing a phase change fluid, the chamber being defined between the inner surface of a first tube and the outer surface of a second tube telescoped within the first tube, the telescoping tubes surrounding the fins.

14. The heat transfer system according to claim 13, further comprising a remote heat exchanger in heat conducting relation with the phase change fluid cooling system at a location spaced from the base.

15. The heat transfer system according to claim 13, wherein the phase change fluid cooling system forms a tunnel about the fins for the flow of a fluid coolant past the fins.

16. A heat transfer system comprising:
   a heatsink including a base and fins arranged in heat conducting relation at one end thereof with the base; and
   a phase change fluid cooling system extending apart from the fins from the base to a second end of the fins opposite the one end thereof,
   wherein the base of the heatsink is a tapered solid metal block located within a chamber of the phase change fluid cooling system.

17. The heat transfer system according to claim 16, wherein the base is surrounded by a phase change fluid in the chamber.

18. A system to cool a heat dissipating electronic component comprising:
   a heatsink including a base in the form of a solid block having a first surface to be arranged in heat conducting relation to an electronic component to be cooled and fins arranged in heat conducting relation at one end thereof with a second surface of the solid block opposite said first surface thereof; and
   a chamber containing a phase change fluid extending peripherally of the fins from the base to a second end of the fins opposite the one end thereof.

19. The system according to claim 18, wherein the chamber forms a tunnel around the fins which serves as a duct through which a fluid coolant can be flowed for heat exchange with the fins.

20. The system according to claim 19, wherein the one and second ends of the fins are in thermal contact with opposed inner surfaces of the tunnel formed by the chamber.

21. The system according to claim 20, wherein the base is located within the chamber in heat conducting relation with the one end of the fins.

22. The system according to claim 18, further comprising an additional remote heat exchanger in heat conducting relation with the phase change fluid in the chamber.

23. The system according to claim 18, wherein the base is surrounded by the phase change fluid.

24. A method of cooling a heat dissipating electronic component comprising:
   conducting heat directly from the electronic component by way of a heatsink including a base in the form of a solid block having a first surface in heat conducting relation with the electronic component and fins arranged in heat conducting relation at one end thereof with a second surface of the solid block opposite said first surface thereof, and
   transferring heat from the periphery of the solid block of the base to the fins at a location spaced from the one end thereof with a phase change fluid separated from the fins.

25. The method according to claim 24, including containing the phase change fluid in a chamber which extends peripherally of the fins, the chamber being defined between the inner surface of a first tube and the outer surface of a second tube telescoped within the first tube, the two telescoping tubes forming a tunnel around the fins, and flowing a cooling fluid through the tunnel to transfer heat from the fins.

26. In a method of cooling a heat dissipating electronic component comprising transferring heat from the electronic component by way of a heatsink including a base in heat conducting relation with the electronic component and fins arranged in heat conducting relation at one end thereof with the base, the improvement comprising:
   transferring heat from the base to the fins at a location spaced from the one end thereof with a phase change fluid separated from the fins, and
   including containing the phase change fluid in a chamber which extends peripherally of the fins between two telescoping tubes which form a tunnel around the fins, and flowing a cooling fluid through the tunnel to transfer heat from the fins, and
   said method including removing heat from the phase change fluid in the chamber with a remote heat exchanger attached to a surface of the chamber.

* * * * *